US009377487B2

(12) United States Patent
Koury, Jr. et al.

(10) Patent No.: US 9,377,487 B2
(45) Date of Patent: Jun. 28, 2016

(54) TRANSDUCER STRUCTURE AND METHOD FOR MEMS DEVICES

(71) Applicant: mCube Inc., San Jose, CA (US)

(72) Inventors: Daniel N. Koury, Jr., Mesa, AZ (US); Sudheer Sridharamurthy, Menlo Park, CA (US)

(73) Assignee: mCube Inc., San Jose, CA (US)

( * ) Notice: Subject to any disclaimer, the term of this patent is extended or adjusted under 35 U.S.C. 154(b) by 322 days.

(21) Appl. No.: 13/922,539

(22) Filed: Jun. 20, 2013

(65) Prior Publication Data

US 2015/0241479 A1    Aug. 27, 2015

Related U.S. Application Data

(62) Division of application No. 12/859,672, filed on Aug. 19, 2010, now Pat. No. 8,477,473.

(51) Int. Cl.

| | |
|---|---|
| *H01G 7/00* | (2006.01) |
| *G01R 3/00* | (2006.01) |
| *G01P 15/125* | (2006.01) |
| *B81B 3/00* | (2006.01) |
| *G01C 19/5783* | (2012.01) |
| *G01P 15/08* | (2006.01) |

(52) U.S. Cl.
CPC ................ *G01R 3/00* (2013.01); *B81B 3/0072* (2013.01); *G01C 19/5783* (2013.01); *G01P 15/125* (2013.01); *B81B 2203/0163* (2013.01); *B81B 2203/0307* (2013.01); *G01P 2015/0857* (2013.01); *Y10T 29/49007* (2015.01)

(58) Field of Classification Search
CPC .............. Y10T 29/49005; Y10T 29/42; Y10T 428/24273; B06B 1/0292; G01N 29/2406; B81C 1/00134; H03H 9/2405; B81B 2203/0136; B81B 2203/0163; B81B 2203/0307
USPC ..................... 29/25.41, 25.35, 593, 594, 595; 361/280, 287, 763, 769, 787, 807; 381/174, 176
See application file for complete search history.

(56) References Cited

U.S. PATENT DOCUMENTS

| | | | |
|---|---|---|---|
| 3,614,677 | A | 10/1971 | Wilfinger |
| 4,954,698 | A | 9/1990 | Yasunaga et al. |
| 5,140,745 | A | 8/1992 | McKenzie |
| 5,157,841 | A | 10/1992 | Dinsmore |
| 5,173,597 | A | 12/1992 | Anglin |
| 5,488,765 | A | 2/1996 | Kubota et al. |
| 5,493,769 | A | 2/1996 | Sakai et al. |
| 5,610,414 | A | 3/1997 | Yoneda et al. |
| 5,668,033 | A | 9/1997 | Ohara |
| 5,729,074 | A | 3/1998 | Shiomi et al. |
| 6,046,409 | A | 4/2000 | Ishii et al. |
| 6,076,731 | A | 6/2000 | Terrell |
| 6,115,261 | A | 9/2000 | Platt et al. |
| 6,188,322 | B1 | 2/2001 | Yao |

(Continued)

*Primary Examiner* — Thiem Phan
(74) *Attorney, Agent, or Firm* — Kilpatrick Townsend and Stockton LLP

(57) ABSTRACT

An improved MEMS transducer apparatus and method is provided. The apparatus has a movable base structure including an outer surface region and at least one portion removed to form at least one inner surface region. At least one intermediate anchor structure is disposed within the inner surface region. The apparatus includes an intermediate spring structure operably coupled to the central anchor structure, and at least one portion of the inner surface region. A capacitor element is disposed within the inner surface region.

16 Claims, 6 Drawing Sheets

(56) References Cited

U.S. PATENT DOCUMENTS

| | | |
|---|---|---|
| 6,263,736 B1 | 7/2001 | Thunder et al. |
| 6,278,178 B1 | 8/2001 | Kwon et al. |
| 6,480,699 B1 | 11/2002 | Lovoi |
| 6,483,172 B1 | 11/2002 | Cote |
| 6,485,273 B1 | 11/2002 | Goodwin-Johansson |
| 6,534,726 B1 | 3/2003 | Okada et al. |
| 6,576,999 B2 | 6/2003 | Sakai et al. |
| 6,656,604 B2 | 12/2003 | Hasewaga |
| 6,753,664 B2 | 6/2004 | Neufeld et al. |
| 6,855,572 B2 | 2/2005 | Jeung et al. |
| 6,912,336 B2 | 6/2005 | Ishii |
| 6,933,165 B2 | 8/2005 | Musolf et al. |
| 6,979,872 B2 | 12/2005 | Borwick |
| 7,019,434 B2 | 3/2006 | Helmbrecht |
| 7,095,226 B2 | 8/2006 | Wan et al. |
| 7,145,555 B2 | 12/2006 | Taylor et al. |
| 7,183,630 B1 | 2/2007 | Fogelson et al. |
| 7,193,312 B2 | 3/2007 | Boon et al. |
| 7,195,945 B1 | 3/2007 | Edelstein et al. |
| 7,239,000 B2 | 7/2007 | Witcraft |
| 7,253,079 B2 | 8/2007 | Hanson et al. |
| 7,258,009 B2 | 8/2007 | Imai |
| 7,358,724 B2 | 4/2008 | Taylor et al. |
| 7,370,530 B2 | 5/2008 | DCamp et al. |
| 7,391,091 B2 | 6/2008 | Tondra |
| 7,402,449 B2 | 7/2008 | Fukuda et al. |
| 7,430,674 B2 | 9/2008 | Van Mueller et al. |
| 7,453,269 B2 | 11/2008 | Won et al. |
| 7,454,705 B2 | 11/2008 | Cadez et al. |
| 7,456,042 B2 | 11/2008 | Stark |
| 7,493,496 B2 | 2/2009 | Smith et al. |
| 7,498,715 B2 | 3/2009 | Yang |
| 7,511,379 B1 | 3/2009 | Flint |
| 7,514,760 B1 | 4/2009 | Quevy |
| 7,521,783 B2 | 4/2009 | Tsai et al. |
| 7,536,909 B2 | 5/2009 | Zhao et al. |
| 7,585,750 B2 | 9/2009 | Do et al. |
| 7,599,277 B1 | 10/2009 | Kato et al. |
| 7,612,443 B1 | 11/2009 | Bernstein et al. |
| 7,671,478 B2 | 3/2010 | Wathanawasam et al. |
| 7,676,340 B2 | 3/2010 | Yasui |
| 7,690,255 B2 | 4/2010 | Gogoi et al. |
| 7,708,189 B1 | 5/2010 | Cipriano |
| 7,713,785 B1 | 5/2010 | Flint |
| 7,779,689 B2 | 8/2010 | Li et al. |
| 7,814,791 B2 | 10/2010 | Andersson et al. |
| 7,814,792 B2 | 10/2010 | Tateyama et al. |
| 7,814,793 B2 | 10/2010 | Sato |
| 7,861,422 B2 | 1/2011 | MacDonald |
| 7,891,103 B2 | 2/2011 | Mayor |
| 8,011,577 B2 | 9/2011 | Mullen et al. |
| 8,016,191 B2 | 9/2011 | Bonalle et al. |
| 8,037,758 B2 | 10/2011 | Sato |
| 8,056,412 B2 | 11/2011 | Rutkiewicz et al. |
| 8,061,049 B2 | 11/2011 | Mayor |
| 8,070,055 B2 | 12/2011 | Block et al. |
| 8,087,296 B2 | 1/2012 | Ueda et al. |
| 8,140,358 B1 | 3/2012 | Ling et al. |
| 8,148,808 B2 | 4/2012 | Braden et al. |
| 8,165,323 B2 | 4/2012 | Zhou |
| 8,181,874 B1 | 5/2012 | Wan et al. |
| 8,227,285 B1 | 7/2012 | Yang |
| 8,236,577 B1 | 8/2012 | Hsu |
| 8,245,923 B1 | 8/2012 | Merrill et al. |
| 8,250,921 B2 | 8/2012 | Nasiri et al. |
| 8,259,311 B2 | 9/2012 | Petschko |
| 8,324,047 B1 | 12/2012 | Yang |
| 8,342,021 B2 | 1/2013 | Oshio |
| 8,367,522 B1 | 2/2013 | Yang |
| 8,395,252 B1 | 3/2013 | Yang |
| 8,395,381 B2 | 3/2013 | Lo |
| 8,402,666 B1 | 3/2013 | Hsu et al. |
| 8,407,905 B1 | 4/2013 | Hsu et al. |
| 8,421,082 B1 | 4/2013 | Yang |
| 8,476,084 B1 | 7/2013 | Yang et al. |
| 8,476,129 B1 | 7/2013 | Jensen et al. |
| 8,477,473 B1 | 7/2013 | Koury et al. |
| 8,486,723 B1 | 7/2013 | Wan et al. |
| 2001/0053565 A1 | 12/2001 | Khoury |
| 2002/0072163 A1 | 6/2002 | Wong et al. |
| 2002/0134837 A1 | 9/2002 | Kishon |
| 2003/0058069 A1 | 3/2003 | Schwartz et al. |
| 2003/0095115 A1 | 5/2003 | Brian et al. |
| 2003/0133489 A1 | 7/2003 | Hirota et al. |
| 2003/0184189 A1 | 10/2003 | Sinclair |
| 2003/0230802 A1 | 12/2003 | Poo et al. |
| 2004/0002808 A1 | 1/2004 | Hashimoto et al. |
| 2004/0016995 A1 | 1/2004 | Kuo et al. |
| 2004/0017644 A1 | 1/2004 | Goodwin-Johansson |
| 2004/0056742 A1 | 3/2004 | Dabbaj |
| 2004/0063325 A1 | 4/2004 | Urano et al. |
| 2004/0104268 A1 | 6/2004 | Bailey |
| 2004/0113246 A1 | 6/2004 | Boon |
| 2004/0119836 A1 | 6/2004 | Kitaguchi et al. |
| 2004/0140962 A1 | 7/2004 | Wang et al. |
| 2004/0177045 A1 | 9/2004 | Brown |
| 2004/0207035 A1 | 10/2004 | Witcraft et al. |
| 2004/0227160 A1 | 11/2004 | Nasu et al. |
| 2004/0227201 A1 | 11/2004 | Borwick et al. |
| 2005/0074147 A1 | 4/2005 | Smith et al. |
| 2005/0090038 A1 | 4/2005 | Wallace |
| 2005/0174338 A1 | 8/2005 | Ing |
| 2005/0199791 A1 | 9/2005 | Sengoku et al. |
| 2005/0247787 A1 | 11/2005 | Von Mueller et al. |
| 2006/0049826 A1 | 3/2006 | Daneman et al. |
| 2006/0081954 A1 | 4/2006 | Tondra et al. |
| 2006/0141786 A1 | 6/2006 | Boezen et al. |
| 2006/0168832 A1 | 8/2006 | Yasui et al. |
| 2006/0192465 A1 | 8/2006 | Kornbluh et al. |
| 2006/0208326 A1 | 9/2006 | Nasiri et al. |
| 2006/0211044 A1 | 9/2006 | Green |
| 2006/0238621 A1 | 10/2006 | Okubo et al. |
| 2006/0243049 A1 | 11/2006 | Ohta et al. |
| 2006/0274399 A1 | 12/2006 | Yang |
| 2007/0046239 A1 | 3/2007 | Hashizume |
| 2007/0132733 A1 | 6/2007 | Ram |
| 2007/0152976 A1 | 7/2007 | Townsend et al. |
| 2007/0181962 A1 | 8/2007 | Partridge et al. |
| 2007/0200564 A1 | 8/2007 | Motz et al. |
| 2007/0281379 A1 | 12/2007 | Stark et al. |
| 2008/0014682 A1 | 1/2008 | Yang et al. |
| 2008/0066547 A1 | 3/2008 | Tanaka et al. |
| 2008/0110259 A1 | 5/2008 | Takeno |
| 2008/0119000 A1 | 5/2008 | Yeh et al. |
| 2008/0123242 A1 | 5/2008 | Zhou |
| 2008/0210007 A1 | 9/2008 | Yamaji et al. |
| 2008/0211043 A1 | 9/2008 | Chen |
| 2008/0211113 A1 | 9/2008 | Chua et al. |
| 2008/0211450 A1 | 9/2008 | Yamada et al. |
| 2008/0277747 A1 | 11/2008 | Ahmad |
| 2008/0283991 A1 | 11/2008 | Reinert |
| 2009/0007661 A1 | 1/2009 | Nasiri et al. |
| 2009/0015251 A1 | 1/2009 | Azumi et al. |
| 2009/0049911 A1 | 2/2009 | Fukuda et al. |
| 2009/0108440 A1 | 4/2009 | Meyer et al. |
| 2009/0115412 A1 | 5/2009 | Fuse |
| 2009/0153500 A1 | 6/2009 | Cho et al. |
| 2009/0262074 A1 | 10/2009 | Nasiri et al. |
| 2009/0267906 A1 | 10/2009 | Schroderus |
| 2009/0307557 A1 | 12/2009 | Rao et al. |
| 2009/0321510 A1 | 12/2009 | Day et al. |
| 2010/0044121 A1 | 2/2010 | Simon et al. |
| 2010/0045282 A1 | 2/2010 | Shibasaki et al. |
| 2010/0071467 A1 | 3/2010 | Nasiri et al. |
| 2010/0075481 A1 | 3/2010 | Yang |
| 2010/0083756 A1 | 4/2010 | Merz et al. |
| 2010/0095769 A1 | 4/2010 | Matsumoto et al. |
| 2010/0109102 A1 | 5/2010 | Chen et al. |
| 2010/0171570 A1 | 7/2010 | Chandrahalim |
| 2010/0208118 A1 | 8/2010 | Ueyama |
| 2010/0236327 A1 | 9/2010 | Mao |
| 2010/0248662 A1 | 9/2010 | Sheynblat et al. |
| 2010/0260388 A1 | 10/2010 | Garrett et al. |

(56) References Cited

U.S. PATENT DOCUMENTS

| | | |
|---|---|---|
| 2010/0302199 A1 | 12/2010 | Taylor et al. |
| 2010/0306117 A1 | 12/2010 | Terayoko |
| 2010/0307016 A1 | 12/2010 | Mayor et al. |
| 2010/0312519 A1 | 12/2010 | Huang et al. |
| 2011/0131825 A1 | 6/2011 | Mayor et al. |
| 2011/0146401 A1 | 6/2011 | Inaguma et al. |
| 2011/0154905 A1 | 6/2011 | Hsu |
| 2011/0172918 A1 | 7/2011 | Tome |
| 2011/0183456 A1 | 7/2011 | Hsieh et al. |
| 2011/0198395 A1 | 8/2011 | Chen |
| 2011/0265574 A1 | 11/2011 | Yang |
| 2011/0266340 A9 | 11/2011 | Block et al. |
| 2011/0312349 A1 | 12/2011 | Forutanpour et al. |
| 2012/0007597 A1 | 1/2012 | Seeger et al. |
| 2012/0007598 A1 | 1/2012 | Lo et al. |
| 2012/0215475 A1 | 8/2012 | Rutledge et al. |

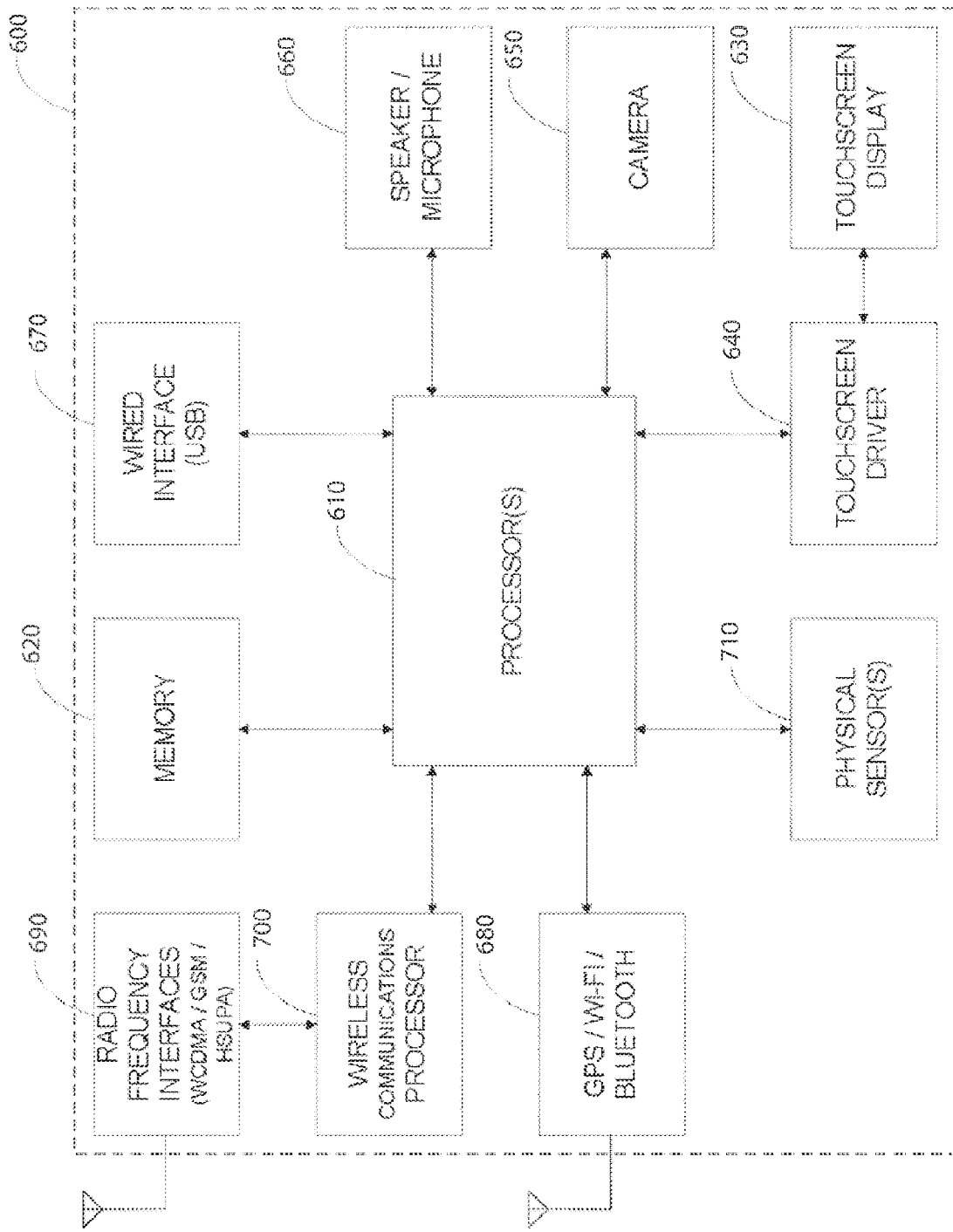

TRANSDUCER STRUCTURE AND METHOD FOR MEMS DEVICES

CROSS-REFERENCES TO RELATED APPLICATIONS

The present application is a divisional application of patent application Ser. No. 12/859,672, filed Aug. 19, 2010, which is commonly owned and incorporated by reference for all purposes.

BACKGROUND OF THE INVENTION

This invention relates generally to integrated devices. More specifically, the invention provides an integrated transducer apparatus that can be used in combination with other micro-electromechanical systems (MEMS) devices, but can have other uses as well. Typical MEMS devices include accelerometers, angular rate sensors, magnetic field sensors, pressure sensors, microphones, humidity sensors, temperature sensors, chemical sensors, biosensors, inertial sensors, and others.

Research and development in integrated microelectronics have continued to produce progress in CMOS and MEMS technology. CMOS technology has become the predominant fabrication technology for integrated circuits (ICs). In layman's terms, ICs are the "brains" of an integrated device and provide decision-making capabilities, while MEMS are the "eyes" and "arms" and provide the ability to sense and control the environment. Some examples of the widespread application of these technologies are the switches in radio frequency (RF) antenna systems, such as those in the iPhone™ or iPad™ device by Apple, Inc. of Cupertino, Calif. and the Blackberry™ phone by Research In Motion Limited of Waterloo, Ontario, Canada. They are also used to provide accelerometers in sensor-equipped game devices, such as those in the Wii™ controller manufactured by Nintendo Company Limited of Japan. Though they are not always easily identifiable, these technologies are becoming more prevalent every day.

Beyond consumer electronics, use of IC and MEMS technology has applications through modular measurement devices such as accelerometers, angular rate sensors, actuators, and other sensors. In conventional vehicles, accelerometers and angular rate sensors are used to deploy airbags and trigger dynamic stability control functions, respectively. MEMS angular rate sensors can also be used for image stabilization systems in video and still cameras, automatic steering systems in airplanes and guided munitions, or the like. MEMS can also be in the form of biological MEMS (Bio-MEMS) that can be used to implement biological and/or chemical sensors for Lab-On-Chip applications. Such applications may integrate one or more laboratory functions on a single millimeter-sized chip. Other applications include Internet and telephone networks, security and financial applications, and health care and medical systems. As described previously, ICs and MEMS can be used to practically engage in various type of environmental interaction.

Although highly successful, ICs, and in particular MEMS, still have limitations. Additionally, applications of MEMS often require increasingly complex microsystems that desire greater computational power. From the above, it is seen that techniques for improving operation of IC devices and MEMS are desired.

BRIEF SUMMARY OF THE INVENTION

According to the present invention, techniques related generally to integrated devices and systems are provided. More specifically, the present invention provides an improved MEMS transducer apparatus that can be used in combination with other MEMS devices, or other devices. Typical MEMS devices include accelerometers, angular rate sensors, magnetic field sensors, pressure sensors, microphones, humidity sensors, temperature sensors, chemical sensors, biosensors, inertial sensors, and others. It will be recognized that the invention has a broad range of applicability.

In a specific embodiment, the invention provides an integrated transducer apparatus disposed upon a substrate member having a surface region. The apparatus has a movable base structure having an outer surface region. The movable base member can have at least one portion removed to form at least one inner surface region. At least one intermediate anchor structure can be spatially disposed within a vicinity of the inner surface region(s) and at least one intermediate spring structure can be coupled to at least one portion of the inner surface region(s) and the intermediate anchor structure(s). There can be the same number of spring structures as anchor structures within the integrated transducer device.

Many benefits are achieved by the invention over conventional techniques. For example, the present technique provides an easy to use process. The method provides higher device yields in dice per wafer with the integrated approach. Additionally, the method provides a process and apparatus that are compatible with existing process technology without substantial modifications to equipment and processes. Preferably, the invention provides for an improved MEMS device apparatus for a variety of uses. In other embodiments, the invention provides an improved MEMS transducer apparatus, which may be integrated on at least one integrated electronic device structure. These and other benefits will be described in more throughout the present specification and more particularly below.

Additional features and advantages of the present invention can be more fully appreciated with reference to the detailed description and accompanying drawings that follow

BRIEF DESCRIPTION OF THE DRAWINGS

The diagrams disclosed in the present patent application are merely implementation examples, which should not unduly limit the scope of the claims herein. The examples and embodiments described herein are for illustrative purposes only and that various modifications or changes in light thereof will be suggested to persons skilled in the art, and these are to be included within the spirit and purview of this process and scope of the appended claims.

FIG. 6 is a simplified block diagram of a device incorporating various embodiments of the present invention.

DETAILED DESCRIPTION OF THE INVENTION

Figure 1:
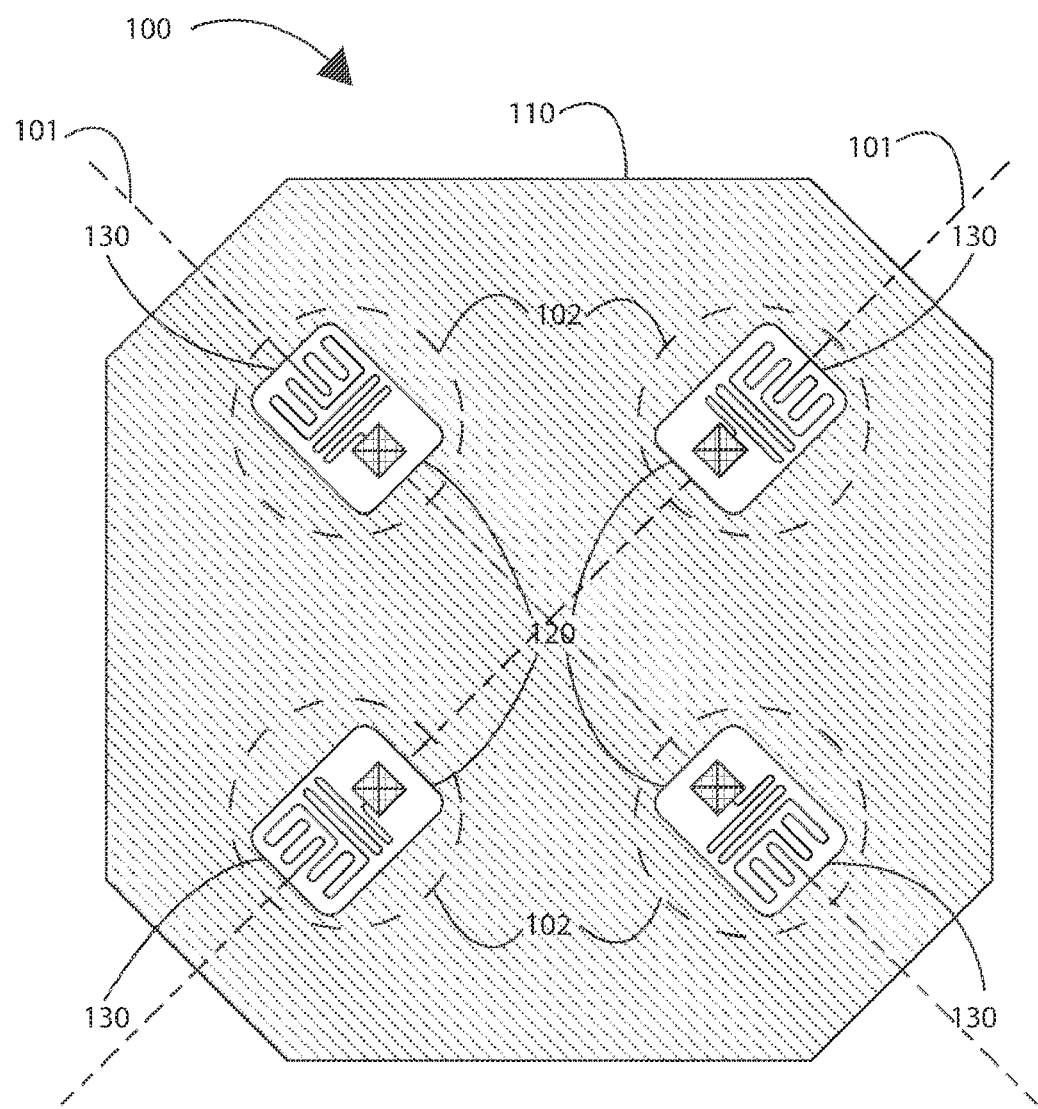
FIG. 1 is a simplified top diagram of a transducer apparatus according to an embodiment of the present invention.

The invention provides an improved MEMS transducer apparatus that can be used with other MEMS devices, or other devices. FIG. 1 is a simplified top diagram of a transducer apparatus according to an embodiment of the present invention. As shown, apparatus 100 includes a movable base structure 110, at least one intermediate anchor structure 120, and at least one intermediate spring structure 130. In an embodiment, apparatus 100 can be configured to improve tolerance of external deformations.

In various embodiments, movable base structure 110 can have an outer surface region, and have at least one portion removed to form at least one cavity having a cavity inner surface region 102, the cavity disposed substantially within the movable base structure. In a specific embodiment, movable base structure 110 can be formed from a single crystal silicon, polycrystalline silicon, or amorphous silicon material. Moveable base structure 110 can also include a thickness of a polymer or a thickness of a metal material. In other embodiments, movable base structure 110 can include other materials and combinations thereof. In a specific embodiment, movable base structure 110 can be a rectangular movable base structure, a patterned polygonal base structure, or the like.

In various embodiments, intermediate anchor structure(s) 120 can be spatially disposed within a vicinity of inner surface region(s) 102 of the movable base structure. In a specific embodiment, intermediate anchor structure(s) 120 can be formed from single crystal silicon, polycrystalline silicon, amorphous silicon material, or the like. Intermediate anchor structure(s) 120 can also include a polymer or metal material, or other materials or combinations thereof.

In an embodiment, intermediate spring structure(s) 130 can be operably coupled to the intermediate anchor structure(s) 120 and at least one portion of inner surface region(s) 102 of movable base structure 110. In a specific embodiment, intermediate spring structure(s) 130 can be formed from single crystal silicon, polycrystalline silicon, amorphous silicon material, or the like. Intermediate spring structure(s) 130 can also include a polymer or metal material, or other materials or combinations thereof. In a specific embodiment, intermediate spring structure(s) 130 can be spatially oriented to be substantially 45 degrees or substantially (pi/4) radians to the edges of the die. The intermediate spring structure(s) can have at least one segment having a segment length. To determine the orientation of a spring, the segments of the spring, which are connected by folds, are used as a reference. The segments would be positioned such that the segments are perpendicular to diagonal lines 101. Another way to determine the orientation of a spring can be done by drawing a "line" connecting the contacts of the spring from the anchor to the movable base (i.e. the end points of the spring). In this case, the proper orientation of the spring would have the "line" forming a substantially 45 degree or (pi/4) radian angle with the edges of a die (pointed along diagonal lines 101).

In an embodiment, apparatus 100 can include at least one capacitor element spatially disposed within a vicinity of inner surface region(s) 102 of movable base structure 110. The capacitor element(s) can include a fixed capacitor element and a movable capacitor element. The movable capacitor element will generally be disposed in a portion of the movable base structure 110. In a specific embodiment, the physical basis of apparatus 100 is to have the average displacement of the fixed capacitor element(s) match the average displacement of the movable capacitor element(s) in response to external deformations.

In an embodiment, apparatus 100 can be coupled to another MEMS device or an electronic device. In a specific embodiment, apparatus 100 can be configured to be tolerant of external deformations. Apparatus 100 can be a transducer apparatus which reduces the area needed for anchors and springs and provides more area for other MEMS components.

As die sizes and MEMS design areas shrink, a premium is placed on the area used for different components of MEMS devices. For example, the inventors believe that the design for a next generation MEMS accelerometer would benefit greatly from the ability to shrink a necessary transducer apparatus, a structure used to convert one form of energy to another. A limitation to this, however is that temperature compensation of these sorts of apparatuses require that the substrate strain field of the movable "proof mass" be "sampled" (i.e. by the spring anchors) at diverse enough locations to be able to compensate or balance the movement/strain of the fixed capacitor plates. In a specific embodiment, this balance can be accomplished with the use of only four springs and anchors that are spatially disposed within intermediate locations. This configuration can be optimized to balance the effect of strain moving the fixed capacitor elements.

Another desirable design aspect contemplated by the inventors is the reduction of the area used for springs. This can be achieved via two approaches. First, by having the springs oriented at substantially 45 degrees or substantially (pi/4) radians with respect to the edges of a die (i.e. aligned to diagonal lines 101), the Young's modulus is reduced and/or minimized with respect to orientation angle for single crystal silicon and standard silicon wafer crystal orientations. One way to determine the orientation of a spring can be done by using the segments of the spring, which are connected by folds, as a reference. The segments would be positioned such that the segments are perpendicular to diagonal lines 101. Another way to determine the orientation of a spring can be done by drawing a "line" connecting the contacts of the spring from the anchor to the movable base (i.e. the end points of the spring). In this case, the proper orientation of the spring would have the "line" forming a substantially 45 degree or (pi/4) radian angle with the edges of a die (pointed along diagonal lines 101). However, the orientations of the springs may only be approximately oriented at the suggested angles due to manufacturing tolerances (orientation angles may be less than or greater than 45 degrees or (pi/4) radians). Second, the number of spring segments, which are connected by folds, should be regulated as too many spring segments may cause the spring structure to be not stiff enough. In various embodiments, the spring stiffness varies inversely with the number of spring segments, but cubic with respect to the spring segment length:

spring constant, $k$ is proportional to $N_{spring}/[N_{segment}*(L^3)]$, where $N_{spring}$=# of springs, $N_{segment}$=# of segments per spring, and $L$=segment length.

However, the number of segments cannot be below a certain number, or the spring segment length will exceed the available die size, or make it impossible to put the anchor for the springs at the properly optimized "intermediate" locations to minimize undesirable variations of output with temperature. As shown, the spring configuration with variable number of spring segments and spring segment length in either of two perpendicular directions represents various embodiments of the present invention. In such embodiments, the area is reduced while keeping the anchor and attachment point to the movable mass along a diagonal center line.

Figure 2:
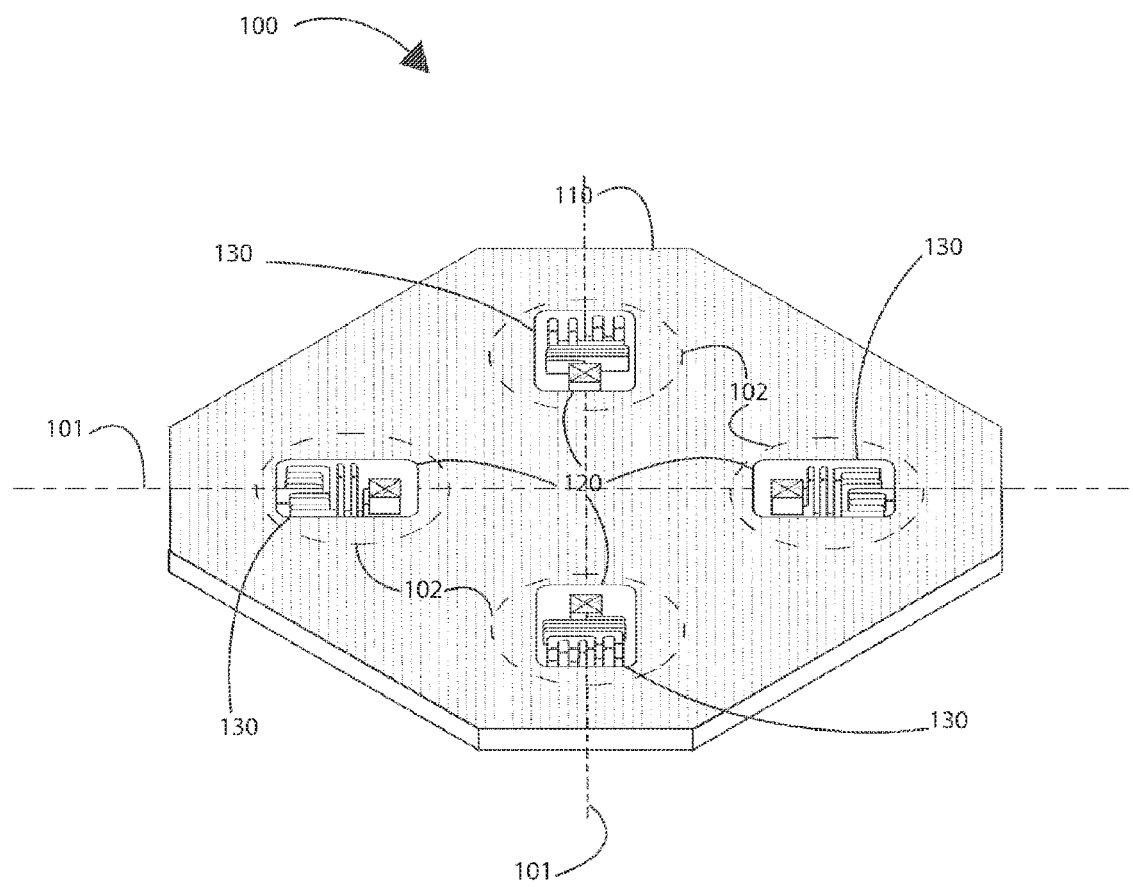
FIG. 2 is a simplified perspective diagram of a transducer apparatus according to an embodiment of the present invention.

FIG. 2 is a simplified perspective diagram of a transducer apparatus according to an embodiment of the present invention. As shown, apparatus 100 includes a movable base structure 110, at least one intermediate anchor structure 120, and at least one intermediate spring structure 130. In an embodiment, apparatus 100 can be configured to improve tolerance of external deformations. A detailed description regarding the elements and configuration of apparatus 100 can be found above in the description for FIG. 1.

Figure 3:
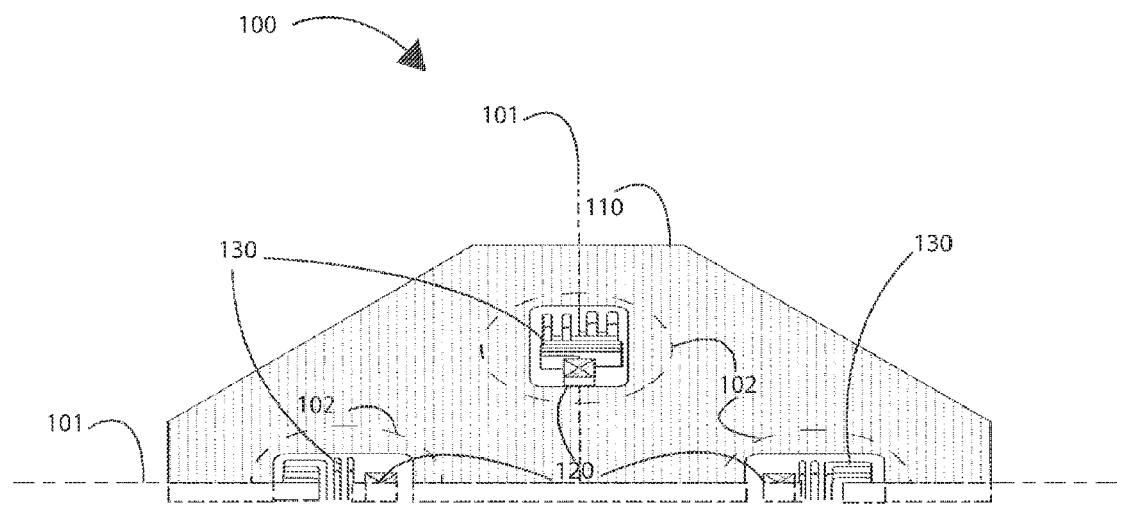
FIG. 3 is a simplified cross-sectional side diagram of a transducer apparatus according to an embodiment of the present invention.

FIG. 3 is a simplified cross-sectional side diagram of a transducer apparatus according to an embodiment of the present invention. As shown, apparatus 100 includes a movable base structure 110, at least one intermediate anchor structure 120, and at least one intermediate spring structure 130. In an embodiment, apparatus 100 can be configured to improve tolerance of external deformations. A detailed description regarding the elements and configuration of apparatus 100 can be found above in the description for FIG. 1.

Figure 4:
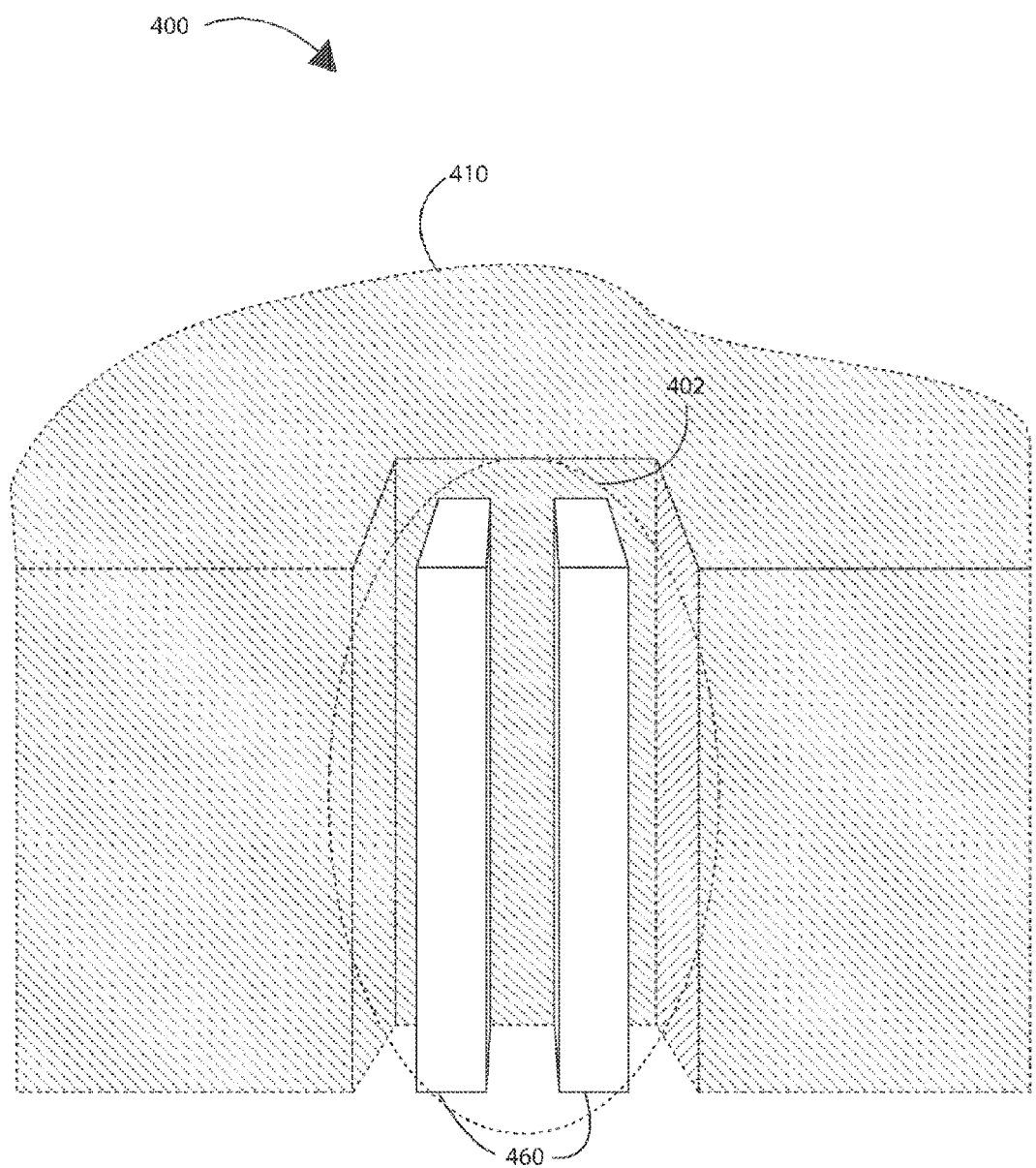
FIG. 4 is a simplified cross-sectional close-up diagram of a transducer apparatus according to an embodiment of the present invention.

FIG. 4 is a simplified cross-sectional close-up diagram of a transducer apparatus according to an embodiment of the present invention. As shown, apparatus 400 includes a movable base structure 410 and at least one capacitor element 460. In an embodiment, capacitor element(s) 460 can include a fixed capacitor element and a movable capacitor element. The movable capacitor element can be disposed on a portion of the movable base structure and the fixed capacitor element can be disposed on a portion of the anchor structure(s). The capacitor element(s) can be tall vertical structures, which can include silicon materials and the like. In an embodiment, apparatus 400 can be configured to improve tolerance of external deformations. Capacitor element(s) 460 can be spatially disposed within a vicinity of inner surface region(s) 402 of the movable base structure. Capacitor element(s) 460 can also include differential capacitor element pair(s). In a specific embodiment, the differential capacitor element pair(s) can operate during motion of movable base structure 410. The charge on one element of the pair can increase while the charge on the other complementary element can decrease. Each differential pair can also be spatially disposed within a vicinity of inner surface region(s) 402, and each pair can be disposed within a vicinity of its own inner surface region, isolated from other pairs. A detailed description regarding the elements and configuration of apparatus 400 can be found above in the description for FIG. 1.

Figure 5:
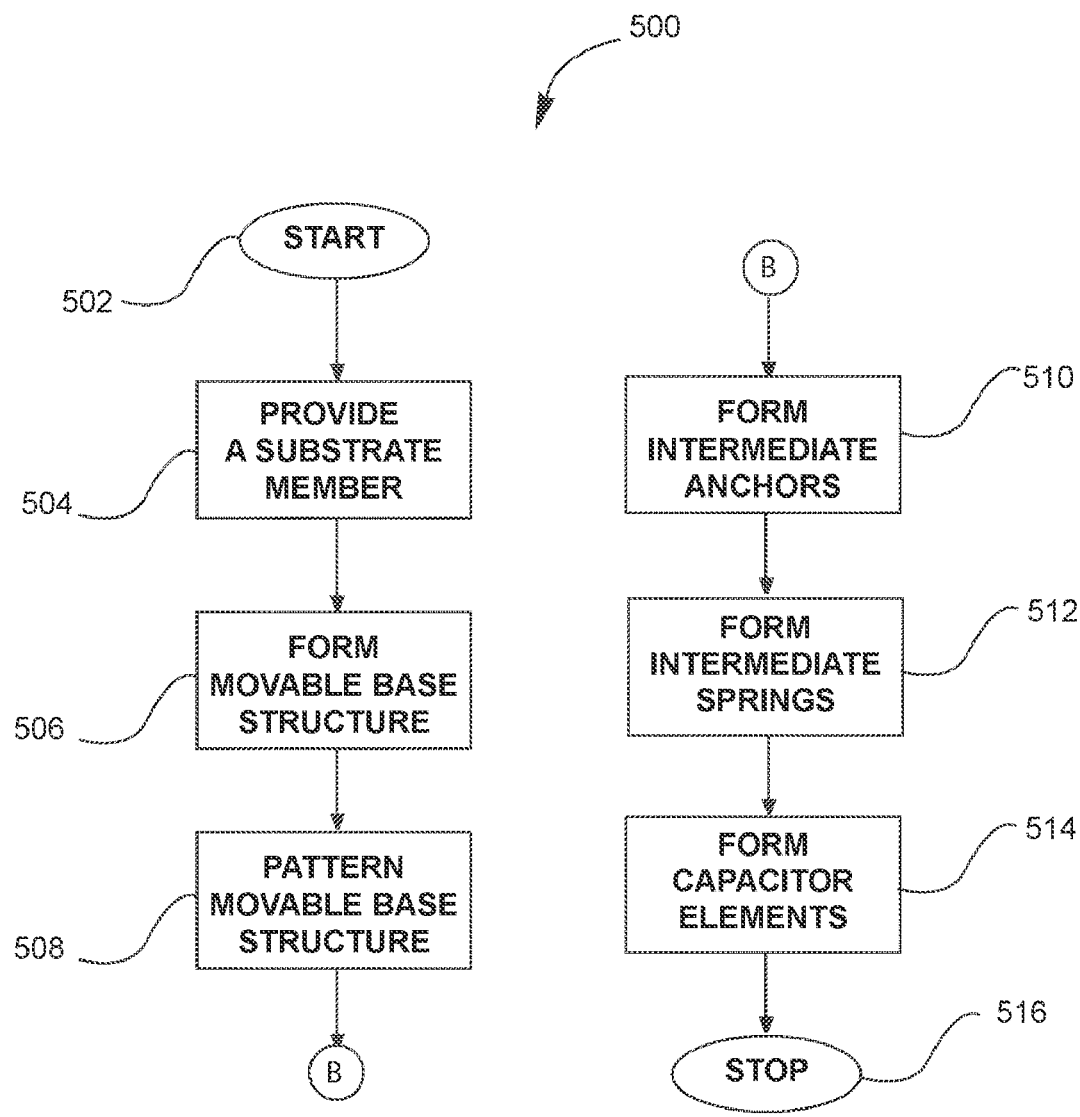
FIG. 5 is a simplified flow diagram of a transducer apparatus according to an embodiment of the present invention.

FIG. 5 is a simplified flow diagram illustrating a method for fabricating a transducer apparatus according to an embodiment of the present invention. It is also understood that the examples and embodiments described herein are for illustrative purposes only and that various modifications or changes in light thereof will be suggested to persons skilled in the art and are to be included within the spirit and purview of this process and scope of the appended claims.

As shown in FIG. 5, the present method can be briefly outlined below.

1. Start;
2. Provide a substrate member;
3. Form a movable base structure;
4. Pattern the movable base structure
5. Form at least one intermediate anchor structure;
6. Form at least one intermediate spring structure;
7. Form at least one capacitor element; and
8. Stop.

These steps are merely examples and should not unduly limit the scope of the claims herein. As shown, the above method provides a way of fabricating a transducer apparatus according to an embodiment of the present invention. One of ordinary skill in the art would recognize many other variations, modifications, and alternatives. For example, various steps outlined above may be added, removed, modified, rearranged, repeated, and/or overlapped, as contemplated within the scope of the invention.

As shown in FIG. 5, method 500 begins at start, step 502. The method provides a fabrication method for forming a MEMS transducer apparatus. In some embodiments, the method provides higher device yields in dice per wafer with the integrated approach. Additionally, the method provides a process and system that are compatible with conventional CMOS process technology without substantial modifications to equipment and processes. Preferably, the invention provides for an improved integrated micro electro-mechanical systems and electronic devices and related methods for a variety of uses.

Following step 502, a substrate member having a surface region can be provided, step 504. The substrate member can include single crystal, polycrystalline, or amorphous silicon. A movable base structure can be formed overlying the surface region, step 506, which can have an outer surface region. In a specific embodiment, the movable base structure can include a single crystal silicon, polycrystalline silicon, or amorphous silicon. The moveable base structure can also include a thickness of a polymer or a thickness of a metal material. In other embodiments, the movable base structure can include other materials and combinations thereof. Additionally, the movable base structure can have at least one portion removed to form at least one inner surface region, step 508.

Next, at least one intermediate anchor structure can be formed and spatially disposed within a vicinity of the inner surface region(s) of the movable base structure, step 510. In a specific embodiment, the central anchor structure(s) and the peripheral anchor structure(s) can include single crystal silicon, polycrystalline silicon, or amorphous silicon. The anchor structures can also include a polymer or metal material, or other materials or combinations thereof.

After forming the anchor structure(s), at least one intermediate spring structure can be formed and operably coupled to the central anchor structure(s) and at least one portion of the inner surface region(s) of movable base structure, step 512. In a specific embodiment, the intermediate spring structure(s) can include single crystal silicon, polycrystalline silicon, or amorphous silicon. The intermediate spring structure(s) can also include a polymer or metal material, or other materials or combinations thereof. In a specific embodiment, the intermediate spring structure(s) can be spatially oriented to be substantially 45 degrees or substantially (pi/4) radians to the edges of a die.

At least one capacitor element can be spatially disposed within a vicinity of the inner surface region(s) of the movable base structure, step 518. In a specific embodiment, the capacitor element(s) can each include a differential capacitor element pair. The capacitor element(s) can include a fixed capacitor element and a movable capacitor element. The capacitor element(s) can be tall vertical structures, which can include silicon materials and the like. The physical basis of the apparatus is to have the average displacement of the fixed capacitor element(s) match the average displacement of the movable capacitor element(s) in response to external deformations. In a specific embodiment, the differential capacitor element pair(s) can operate during motion of the movable base structure. The charge on one element of the pair can increase while the charge on the other complementary element can decrease. Each differential pair can also be spatially disposed within a vicinity of the inner surface region(s), and each pair can be disposed within a vicinity of its own inner surface region, isolated from other pairs.

In an embodiment, the apparatus can be coupled to another MEMS device or an electronic device. In a specific embodiment, the apparatus can be configured to be tolerant of external deformations. The apparatus formed by method 500 can be an integrated transducer apparatus which reduces the area needed for anchors and springs and provides more area for other MEMS components. There can be other variations, modifications, and alternatives as well.

The above sequence of processes provides a fabrication method for forming a MEMS transducer apparatus according to an embodiment of the present invention. As shown, the method uses a combination of steps including providing a substrate member, forming a movable base, removing a portion of the base, forming anchor structure(s), forming spring structure(s), and forming at least one capacitor element. Other alternatives can also be provided where steps are added, one or more steps are removed, or one or more steps are provided in a different sequence without departing from the scope of the claims herein.

FIG. 6 illustrates a functional block diagram of various embodiments of the present invention. In FIG. 6, a computing device 600 typically includes an applications processor 610, memory 620, a touch screen display 630 and driver 640, an image acquisition device 650, audio input/output devices 660, and the like. Additional communications from and to computing device are typically provided by via a wired interface 670, a GPS/Wi-Fi/Bluetooth interface 680, RF interfaces 690 and driver 700, and the like. Also included in various embodiments are physical sensors 710.

In various embodiments, computing device 600 may be a hand-held computing device (e.g. Apple iPad, Apple iTouch, Dell Mini slate, Lenovo Skylight/IdeaPad, Asus EEE series, Microsoft Courier, Notion Ink Adam), a portable telephone (e.g. Apple iPhone, Motorola Droid, Google Nexus One, HTC Incredible/EVO 4G, Palm Pre series, Nokia N900), a portable computer (e.g. netbook, laptop), a media player (e.g. Microsoft Zune, Apple iPod), a reading device (e.g. Amazon Kindle, Barnes and Noble Nook), or the like.

Typically, computing device 600 may include one or more processors 610. Such processors 610 may also be termed application processors, and may include a processor core, a video/graphics core, and other cores. Processors 610 may be a processor from Apple (A4), Intel (Atom), NVidia (Tegra 2), Marvell (Armada), Qualcomm (Snapdragon), Samsung, TI (OMAP), or the like. In various embodiments, the processor core may be an Intel processor, an ARM Holdings processor such as the Cortex-A, -M, -R or ARM series processors, or the like. Further, in various embodiments, the video/graphics core may be an Imagination Technologies processor PowerVR-SGX, -MBX, -VGX graphics, an Nvidia graphics processor (e.g. GeForce), or the like. Other processing capability may include audio processors, interface controllers, and the like. It is contemplated that other existing and/or later-developed processors may be used in various embodiments of the present invention.

In various embodiments, memory 620 may include different types of memory (including memory controllers), such as flash memory (e.g. NOR, NAND), pseudo SRAM, DDR SDRAM, or the like. Memory 620 may be fixed within computing device 600 or removable (e.g. SD, SDHC, MMC, MINI SD, MICRO SD, CF, SIM). The above are examples of computer readable tangible media that may be used to store embodiments of the present invention, such as computer-executable software code (e.g. firmware, application programs), application data, operating system data or the like. It is contemplated that other existing and/or later-developed memory and memory technology may be used in various embodiments of the present invention.

In various embodiments, touch screen display 630 and driver 640 may be based upon a variety of later-developed or current touch screen technology including resistive displays, capacitive displays, optical sensor displays, electromagnetic resonance, or the like. Additionally, touch screen display 630 may include single touch or multiple-touch sensing capability. Any later-developed or conventional output display technology may be used for the output display, such as TFT-LCD, OLED, Plasma, trans-reflective (Pixel Qi), electronic ink (e.g. electrophoretic, electrowetting, interferometric modulating). In various embodiments, the resolution of such displays and the resolution of such touch sensors may be set based upon engineering or non-engineering factors (e.g. sales, marketing). In some embodiments of the present invention, a display output port, such as an HDMI-based port or DVI-based port may also be included.

In some embodiments of the invention, image capture device 650 may include a sensor, driver, lens and the like. The sensor may be based upon any later-developed or convention sensor technology, such as CMOS, CCD, or the like. In various embodiments of the present invention, image recognition software programs are provided to process the image data. For example, such software may provide functionality such as: facial recognition, head tracking, camera parameter control, or the like.

In various embodiments, audio input/output 660 may include conventional microphone(s)/speakers. In some embodiments of the present invention, three-wire or four-wire audio connector ports are included to enable the user to use an external audio device such as external speakers, headphones or combination headphone/microphones. In various embodiments, voice processing and/or recognition software may be provided to applications processor 610 to enable the user to operate computing device 600 by stating voice commands. Additionally, a speech engine may be provided in various embodiments to enable computing device 600 to provide audio status messages, audio response messages, or the like.

In various embodiments, wired interface 670 may be used to provide data transfers between computing device 600 and an external source, such as a computer, a remote server, a storage network, another computing device 600, or the like. Such data may include application data, operating system data, firmware, or the like. Embodiments may include any later-developed or conventional physical interface/protocol, such as: USB 2.0, 3.0, micro USB, mini USB, Firewire, Apple iPod connector, Ethernet, POTS, or the like. Additionally, software that enables communications over such networks is typically provided.

In various embodiments, a wireless interface 680 may also be provided to provide wireless data transfers between computing device 600 and external sources, such as computers, storage networks, headphones, microphones, cameras, or the like. As illustrated in FIG. 6, wireless protocols may include Wi-Fi (e.g. IEEE 802.11a/b/g/n, WiMax), Bluetooth, IR and the like.

GPS receiving capability may also be included in various embodiments of the present invention, however is not required. As illustrated in FIG. 6, GPS functionality is included as part of wireless interface 180 merely for sake of convenience, although in implementation, such functionality is currently performed by circuitry that is distinct from the Wi-Fi circuitry and distinct from the Bluetooth circuitry.

Additional wireless communications may be provided via RF interfaces 690 and drivers 700 in various embodiments. In various embodiments, RF interfaces 690 may support any future-developed or conventional radio frequency communications protocol, such as CDMA-based protocols (e.g. WCDMA), GSM-based protocols, HSUPA-based protocols, or the like. In the embodiments illustrated, driver 700 is illustrated as being distinct from applications processor 610. However, in some embodiments, these functionality are provided upon a single IC package, for example the Marvel PXA330 processor, and the like. It is contemplated that some embodiments of computing device 600 need not include the RF functionality provided by RF interface 690 and driver 700.

FIG. 6 also illustrates computing device 600 to include physical sensors 710. In various embodiments of the present invention, physical sensors 710 can be single axis or multi-axis Micro-Electro-Mechanical Systems (MEMS) based devices being developed by M-cube, the assignee of the present patent application. Physical sensors 710 can include accelerometers, gyroscopes, pressure sensors, magnetic field sensors, bio sensors, and the like. In other embodiments of the present invention, conventional physical sensors 710 from Bosch, STMicroelectronics, Analog Devices, Kionix or the like may be used.

Existing and new operating systems may be supported, such as iPhone OS (e.g. iOS), WindowsMobile (e.g. 7), Google Android (e.g. 2.2), Symbian, or the like. In various embodiments of the present invention, the operating system may be a multi-threaded multi-tasking operating system. Accordingly, inputs and/or outputs from and to touch screen display 630 and driver 640 and inputs/or outputs to physical sensors 710 may be processed in parallel processing threads. In other embodiments, such events or outputs may be processed serially, or the like. Inputs and outputs from other functional blocks may also be processed in parallel or serially, in other embodiments of the present invention, such as image acquisition device 650 and physical sensors 710.

FIG. 6 is representative of one computing device 600 capable of embodying the present invention. It will be readily apparent to one of ordinary skill in the art that many other hardware and software configurations are suitable for use with the present invention. Embodiments of the present invention may include at least some but need not include all of the functional blocks illustrated in FIG. 6. For example, in various embodiments, computing device 600 may lack image acquisition unit 650, or RF interface 690 and/or driver 700, or GPS capability, or the like. Additional functions may also be added to various embodiments of computing device 600, such as a physical keyboard, an additional image acquisition device, a trackball or trackpad, a joystick, or the like. Further, it should be understood that multiple functional blocks may be embodied into a single physical package or device, and various functional blocks may be divided and be performed among separate physical packages or devices.

These diagrams are merely examples, which should not unduly limit the scope of the claims herein. In light of the present invention disclosure, one of ordinary skill in the art would recognize many other variations, modifications, and alternatives. For example, various steps outlined above may be added, removed, modified, rearranged, repeated, and/or overlapped, as contemplated within the scope of the invention. It is also understood that the examples and embodiments described herein are for illustrative purposes only and that various modifications or changes in light thereof will be suggested to persons skilled in the art and are to be included within the spirit and purview of this process and scope of the appended claims.

What is claimed is:

1. A method of fabricating a transducer apparatus, the method comprising:
   providing a substrate member having a surface region;
   forming a movable base structure having an outer surface region overlying the surface region;
   removing at least one portion from the movable base structure to form at least one cavity disposed substantially within the movable base structure, the at least one cavity having a cavity inner surface region;
   forming at least one anchor structure spatially disposed within the at least one cavity, the anchor structure being coupled to at least a portion of the substrate;
   forming at least one spring structure coupled to at least one portion of the cavity inner surface region, the spring structure being coupled to the anchor structure; and
   forming at least one capacitor element spatially disposed within a vicinity of a corresponding cavity.

2. The method of claim 1 wherein the number of the central spring structures is proportional to the number of the capacitor elements.

3. The method of claim 1 wherein the configuration of the central spring structure is defined by the configuration of the capacitor element.

4. The method of claim 1 wherein the movable base structure comprises a material chosen from silicon, a polymer, a dielectric, or a metal.

5. The method of claim 1 wherein the anchor structure comprises a material chosen from silicon, a polymer, a dielectric, or a metal.

6. The method of claim 1 wherein the spring structure comprise comprises a material chosen from silicon, a polymer, a dielectric, or a metal.

7. The method of claim 1 wherein the movable base structure is rectangular.

8. The method of claim 7 wherein the spring structure is spatially oriented to be substantially 45 degrees or substantially (pi/4) radians to the edges of the rectangular movable base structure.

9. The method of claim 1 wherein the spring structure is spatially oriented to be substantially 45 degrees or substantially (pi/4) radians to the edges of a die.

10. The method of claim 1 wherein the movable base structure comprises a material chosen from silicon, a polymer, a dielectric, or a metal.

11. The method of claim 1 wherein the anchor structure(s) comprises a material chosen from silicon, a polymer, a dielectric, or a metal.

12. The method of claim 1 wherein the spring structure(s) comprises a silicon material, a polymer, a dielectric, or metal material.

13. The method of claim 1 wherein each spring structure comprises at least one segment having a segment length.

14. The method of claim 1 wherein the apparatus is operably coupled to a MEMS device or an electronic device.

15. The method of claim 1 wherein the method is configured to fabricate an apparatus tolerant of external deformations.

16. A method of fabricating a transducer apparatus, the method comprising:
   providing a substrate member having a surface region;
   forming a rectangular movable base structure having an outer surface region overlying the surface region, the rectangular movable base structure having four cavities disposed symmetrically substantially within the rectangular movable base structure, the four intermediate cavities being spatially oriented to be substantially 45 degrees or substantially (pi/4) radians to the edges of a die, each of the cavities having a cavity inner surface region;
   forming four anchor structures spatially disposed within the four cavities, each of the four anchor structures being disposed within separate cavities, each of the anchor structures being coupled to at least one portion of the cavity inner surface region of the cavity in which each is disposed;

forming four spring structures, spatially disposed within the four cavities, each of the spring structures being disposed within separate cavities, each of the spring structures being coupled to at least one of the cavity inner surface region of the cavity in which each is disposed, each of the spring structures being coupled to the anchor structure in the same cavity, the spring structures being spatially oriented to be substantially 45 degrees or substantially (pi/4) radians to the edges of a die; and forming at least one capacitor element spatially disposed within each of the cavities.

* * * * *